(12) United States Patent
Jeon et al.

(10) Patent No.: US 9,972,943 B2
(45) Date of Patent: May 15, 2018

(54) MODULAR CONNECTOR RECEPTACLES HAVING PRINTED CIRCUIT BOARD TONGUES

(71) Applicant: Apple Inc., Cupertino, CA (US)

(72) Inventors: James M. Jeon, Cupertino, CA (US); Mahmoud R. Amini, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/274,393

(22) Filed: Sep. 23, 2016

(65) Prior Publication Data

US 2018/0090886 A1 Mar. 29, 2018

(51) Int. Cl.
*H01R 13/6581* (2011.01)
*H01R 13/22* (2006.01)
*H05K 1/11* (2006.01)
*H05K 1/18* (2006.01)
*H05K 1/02* (2006.01)

(52) U.S. Cl.
CPC ......... *H01R 13/6581* (2013.01); *H01R 13/22* (2013.01); *H05K 1/0216* (2013.01); *H05K 1/116* (2013.01); *H05K 1/181* (2013.01)

(58) Field of Classification Search
CPC .................. H01R 13/6585; H01R 13/346; H01R 13/658; H01R 13/659; H01R 13/6581
USPC ..... 439/660, 607.56, 607.27, 607.54, 607.55
See application file for complete search history.

(56) References Cited

U.S. PATENT DOCUMENTS

| 8,968,031 | B2* | 3/2015 | Simmel | H01R 13/659 439/108 |
|---|---|---|---|---|
| 2006/0148319 | A1* | 7/2006 | Huang | H01R 13/65802 439/607.01 |
| 2010/0248543 | A1* | 9/2010 | Yu | H01R 13/6658 439/607.01 |
| 2012/0064769 | A1* | 3/2012 | Su | H01R 13/6581 439/607.55 |
| 2014/0364008 | A1* | 12/2014 | Simmel | H01R 13/64 439/607.23 |
| 2015/0207279 | A1* | 7/2015 | Little | H01R 24/60 439/607.01 |
| 2015/0340783 | A1* | 11/2015 | Lee | H01R 12/71 439/607.29 |

* cited by examiner

*Primary Examiner* — Harshad C Patel
(74) *Attorney, Agent, or Firm* — Kilpatrick Townsend & Stockton, LLP

(57) ABSTRACT

Connector receptacles that may be modular, may be reliable and durable, and may provide a high signal quality. Examples may provide modular connector receptacles having a shielded housing around a tongue supporting a number of contacts. They may provide a high signal quality by using printed circuit boards as tongues and for routing signals, and they may be made durable by using through-hole contacting portions soldered to the printed circuit board and mechanically supported by a header.

22 Claims, 22 Drawing Sheets

MODULAR CONNECTOR RECEPTACLES HAVING PRINTED CIRCUIT BOARD TONGUES

BACKGROUND

Power and data may be provided from one electronic device to another over cables that may include one or more wire conductors, fiber optic cables, or other conductors. Connector inserts may be located at each end of these cables and may be inserted into connector receptacles in the communicating or power transferring electronic devices.

These connector receptacles may be assembled in different ways and the electronic devices housing them may also be assembled in different ways. For example, some connector receptacles may be assembled along with their electronic devices where portions of the connector receptacles may be formed of portions of the electronic devices. Portions of housings of some connector receptacles may be formed using portions of device enclosures for the electronic devices. Portions of interconnect may be shared between a connector and other circuits or components in the electronic devices. Such sharing may provide connector receptacles having specific or improved capabilities. A downside of this approach may be that the assembly process for the electronic device may be relatively complicated.

Other connector receptacles may have a modular form. Modular connector receptacles may enable the use of pick-and-place and other surface-mount technology (SMT) processes used in the assembly of electronic devices. A downside of this approach has been that very high-performance modular connector receptacles have not been available. For example, signal quality may be compromised when using a conventional modular connector receptacle in an electronic device.

Also, connector inserts may be inserted into these connector receptacles many times over the lifetime of the electronic device. Accordingly, it may be desirable that these connector receptacles be reliable and not quickly wear out.

Thus, what is needed are connector receptacles that may be modular, may be reliable and durable, and may provide a high signal quality.

SUMMARY

Accordingly, embodiments of the present invention may provide connector receptacles that may be modular, may be reliable and durable, and may provide a high signal quality. An illustrative embodiment of the present invention may provide a modular connector receptacle. The connector receptacle may be modular in that it may provide pathways from a connector insert to a logic board of an electronic device and it may have its own housing having an opening for the connector insert. Optionally, the housing may be shielded.

These and other embodiments of the present invention may provide a connector receptacle providing a high signal quality by providing a tongue formed of a printed circuit board. The use of a printed circuit board may provide contacts and signal paths having matched impedances, signal isolation and shielding, and other features that may provide a high signal quality or signal integrity. The printed circuit board may be a multi-layer or other type of printed circuit board.

These and other embodiments of the present invention may provide a connector receptacle having a printed circuit board tongue. The printed circuit board tongue may be located in an opening of a connector receptacle housing. A number of pins acting as through-hole contacting portions may be soldered to a rear portion of the printed circuit board, and further soldered to a logic board of an electronic device, where the logic board may be a printed circuit board (separate from the printed circuit board tongue in the connector receptacle), flexible circuit board, or other appropriate substrate. A header may be included for mechanical support for the through-hole contacting portions. This arrangement of a printed circuit board tongue, header, and through-hole contacting portions may provide a connector receptacle that is reliable and durable.

These and other embodiments of the present invention may provide a connector receptacle that is modular. The connector receptacle may be modular in that it may provide pathways from a connector insert to a logic board of an electronic device and may have its own housing having an opening for the connector insert. Optionally, the housing may be shielded. This modular connector receptacle may be placed on a logic board using pick-and-place assembly equipment. This may simplify assembly of electronic devices housing the connector receptacle. Also, during assembly, the modular connector receptacle may be placed in a vertical direction normal to a surface of the logic board. This may simplify assembly on a crowded logic board where lateral space is limited.

In these and other embodiments of the present invention, alignment pins may be used to simplify the assembly of a connector receptacle. These pins may pass through openings in a housing, electromagnetic (EMI) plates, and the printed circuit board to align these components and keep them in position during assembly.

In these and other embodiments of the present invention, each contact on a tongue of a connector receptacle may be independently electrically connected to a corresponding through-hole contacting portion. Using a through-hole contacting portion for each contact may facilitate inspection during assembly as each through-hole contacting portion may be readily viewed and examined after soldering to a logic board. Also, electrical testing may be simplified as each contact may be electrically connected to a separate through-hole contacting portion.

In these and other embodiments of the present invention, connector receptacles may include through-hole contacting portions. These through-hole contacting portions may fit in openings in a logic board to form electrical connections with traces in the logic board. These through-hole contacting portions may also provide mechanical stability for the connector receptacle. In other embodiments of the present invention, some or all of the contacts may terminate in surface-mount contacting portions.

In these and other embodiments of the present invention, one or more electronic devices or components, such as data retiming circuits, impedance circuits, light-emitting diodes, and others may be located on a printed circuit board in the connector receptacle and may be connected to contacts and openings in the printed circuit board through traces in the printed circuit board.

While embodiments of the present invention may be useful in USB Type-C connector receptacles, these and other embodiments of the present invention may be used in other types of connector receptacles for different interfaces.

In various embodiments of the present invention, shields, EMI plates, ground contacts, ground clips, through-hole contacting portions, and other conductive portions of a connector receptacle may be formed by stamping, metal-injection molding, machining, micro-machining, 3-D printing, or other manufacturing process. The conductive portions may be formed of stainless steel, steel, copper, titanium copper, phosphor bronze, or other material or combination of materials. They may be plated or coated with nickel, gold, or other material. The nonconductive portions, such as the housings, headers, reflow caps, and other structures may be formed using injection or other molding, 3-D printing, machining, or other manufacturing process. The nonconductive portions may be formed of silicon or silicone, rubber, hard rubber, plastic, nylon, liquid-crystal polymers (LCPs), ceramics, or other nonconductive material or combination of materials. The printed circuit boards used may be formed of FR-4 or other material.

Embodiments of the present invention may provide connector receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, adapters, remote control devices, chargers, and other devices. These connector receptacles may provide interconnect pathways for signals that are compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention may provide connector receptacles that may be used to provide a reduced set of functions for one or more of these standards. In various embodiments of the present invention, these interconnect paths provided by these connector receptacles may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
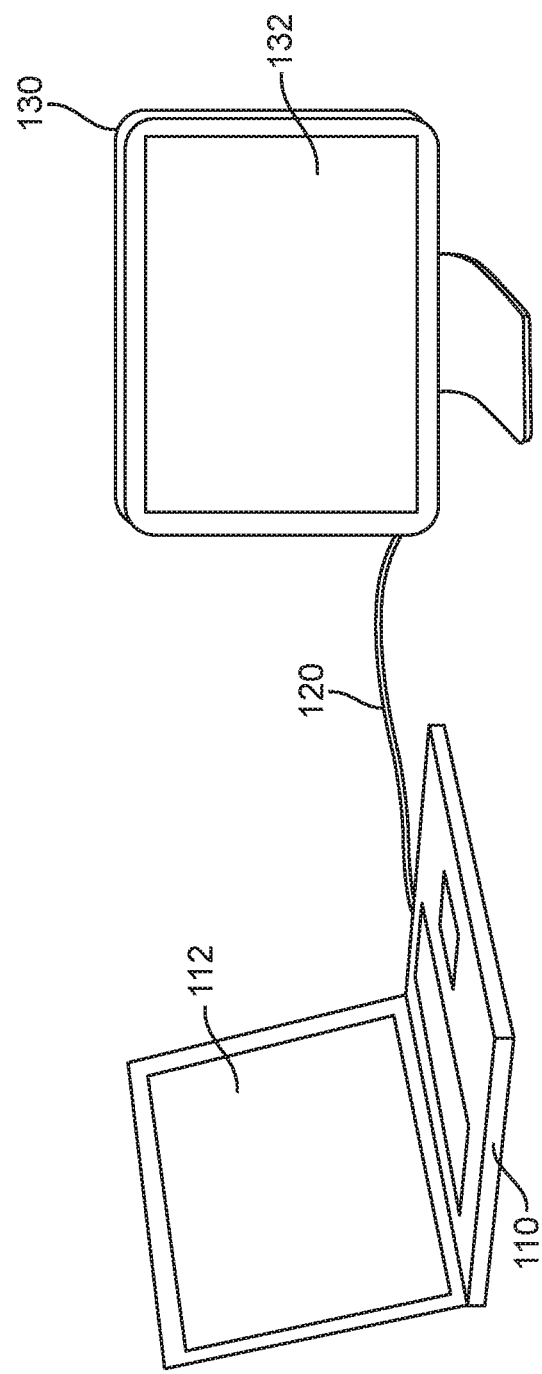
FIG. 1 illustrates an electronic system that may be improved by the incorporation of embodiments of the present invention.

FIG. 1 illustrates an electronic system that may be improved by the incorporation of an embodiment of the present invention. This figure, as with the other included figures, is shown for illustrative purposes and does not limit either the possible embodiments of the present invention or the claims.

This example illustrates monitor 130 that may be in communication with computer 110. Computer 110 may provide video or other data over cable 120 to monitor 130. Video data may be displayed on the video screen 132 of monitor 130. Computer 110 may similarly include a screen 112. In other embodiments the present invention, other types of devices may be included, and other types of data may be shared or transferred among the devices. For example, monitor 130 may be a monitor, an all-in-one computer, tablet computer, or other device. In these and other embodiments of the present invention, power may be shared between computer 110 and monitor 130 over cable 120.

Cable 120 may be one or a number of various types of cables. For example, it may be a Universal Serial Bus (USB) cable such as a USB Type-C cable, Thunderbolt, DisplayPort, Lightning, or other type of cable. Cable 120 may include compatible connector inserts (not shown) that plug into connector receptacles (not shown) on the computer 110 and monitor 130.

Assembly of devices such as computer 110 and monitor 130 may be simplified by using a modular connector receptacle that is formed as a single unit. Performance of the devices may be improved by using a connector receptacle having a high signal quality. The lifetime of the devices may be lengthened and user satisfaction may be improved by incorporating a connector receptacle that is reliable and durable. One such connector receptacle according to an embodiment of the present invention is shown in the following figure.

Figure 2:
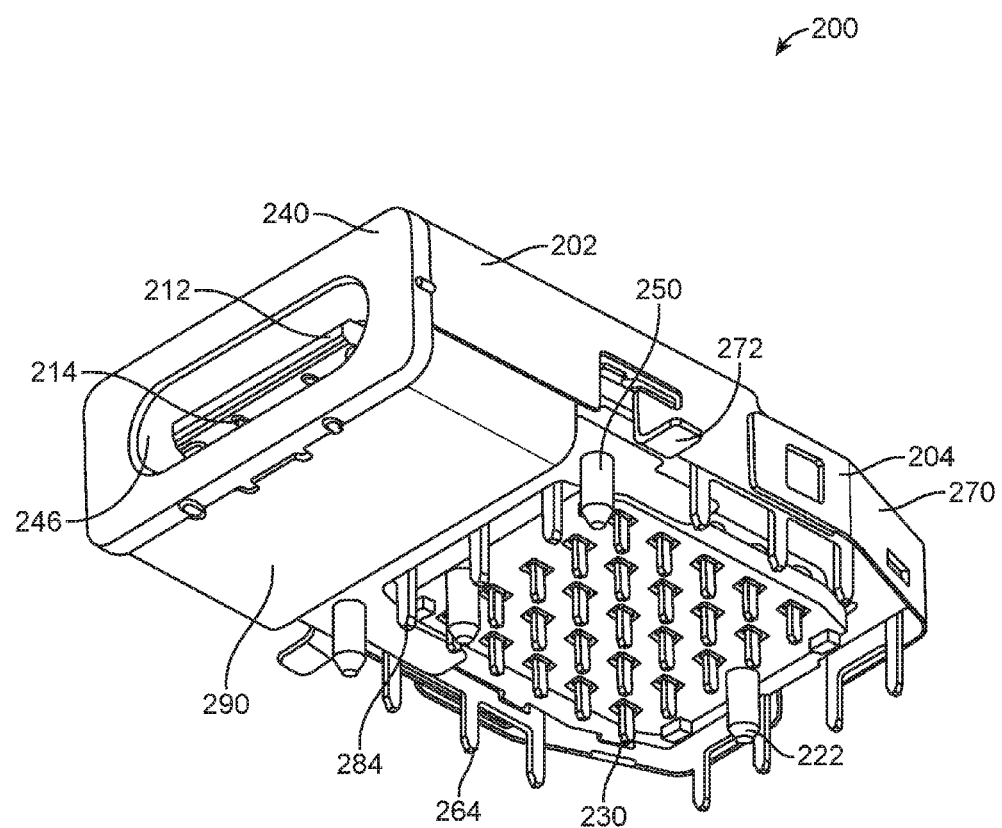
FIG. 2 illustrates a connector receptacle according to an embodiment of the present invention.

FIG. 2 illustrates a connector receptacle according to an embodiment of the present invention. Connector receptacle 200 may accept a connector insert (not shown) and may reside on logic board 2110 (shown in FIG. 21), where logic board 2110 may be a printed circuit board, flexible circuit board, or other appropriate substrate. Connector receptacle 200 may provide pathways for signals and power between the connector insert and logic board 2110.

Connector receptacle 200 may include housing 240 having a front-side opening 246 for accepting a connector insert (not shown) when the connector insert is inserted into connector receptacle 200. Tongue 212 may be located in opening 246 of housing 240. Tongue 212 may support a plurality of contacts 214 on its top and bottom sides. Connector receptacle 200 may be shielded on a top side by top shield 270 and on a bottom side by bottom shield 290. A number of through-hole contacting portions 230 may be electrically connected to contacts 214 and may emerge from an underside of connector receptacle 200. Through-hole contacting portions 230 may be inserted into openings in logic board 2110 (shown in FIG. 21) on which connector receptacle 200 resides in order to connect to components (not shown) on logic board 2110. Through-hole contacting portions 230 may be surrounded by ground tabs 284 and 264. Ground tabs 284 and 264 may be inserted and soldered into openings in logic board 2110 to form connections to ground. In this example, ground tabs 284 and 264 may be located along each side of an array of through-hole contacting portions 230. In this way, ground tabs 284 and 264 may provide a Faraday cage for shielding through-hole contacting portions 230. Posts 284 may be inserted into openings in logic board 2110 for mechanical stabilization. Pins 250 may be used during assembly to align various portions of connector receptacle 200 to each other. Pins 250 may also be inserted into openings in logic board 2110 to form ground connections.

Connector receptacle 200 may include a front portion 202 and a rear portion 204. Rear portion 204 may be attached to a top side of logic board 2110 (shown in FIG. 21). Front portion 202 may extend beyond an edge of logic board 2110. Tab 272 on top shield 270 may position rear portion 204 of receptacle 200 on a top side of logic board 2110.

In these and other embodiments of the present invention, each contact 214 may be independently electrically connected to a corresponding through-hole contacting portion 230. Using a through-hole contacting portion 230 for each contact 214 may facilitate inspection during assembly as each through-hole contacting portion 230 may be readily viewed and examined after soldering to logic board 2110 (shown in FIG. 21). Also, electrical testing may be simplified and improved as each contact 214 may be electrically connected to a separate through-hole contacting portion 230.

Connector receptacle 200 may be a modular connector receptacle. Connector receptacle 200 may be modular in that it may provide pathways from a connector insert (not shown) to logic board 2110 (shown in FIG. 21) and it may have its own housing 240 having an opening 246 for the connector insert. Optionally, the housing 240 may be shielded, for example by top shield 270 and bottom shield 290. Modular connector receptacle 200 may be placed on logic board 2110 using pick-and-place assembly equipment (not shown). This may simplify assembly of electronic devices (not shown) housing connector receptacle 200. Also, during assembly, modular connector receptacle 200 may be placed in a vertical direction normal to a surface of logic board 2110. This may simplify assembly on a crowded logic board 2110 where lateral space is limited.

Figure 3:
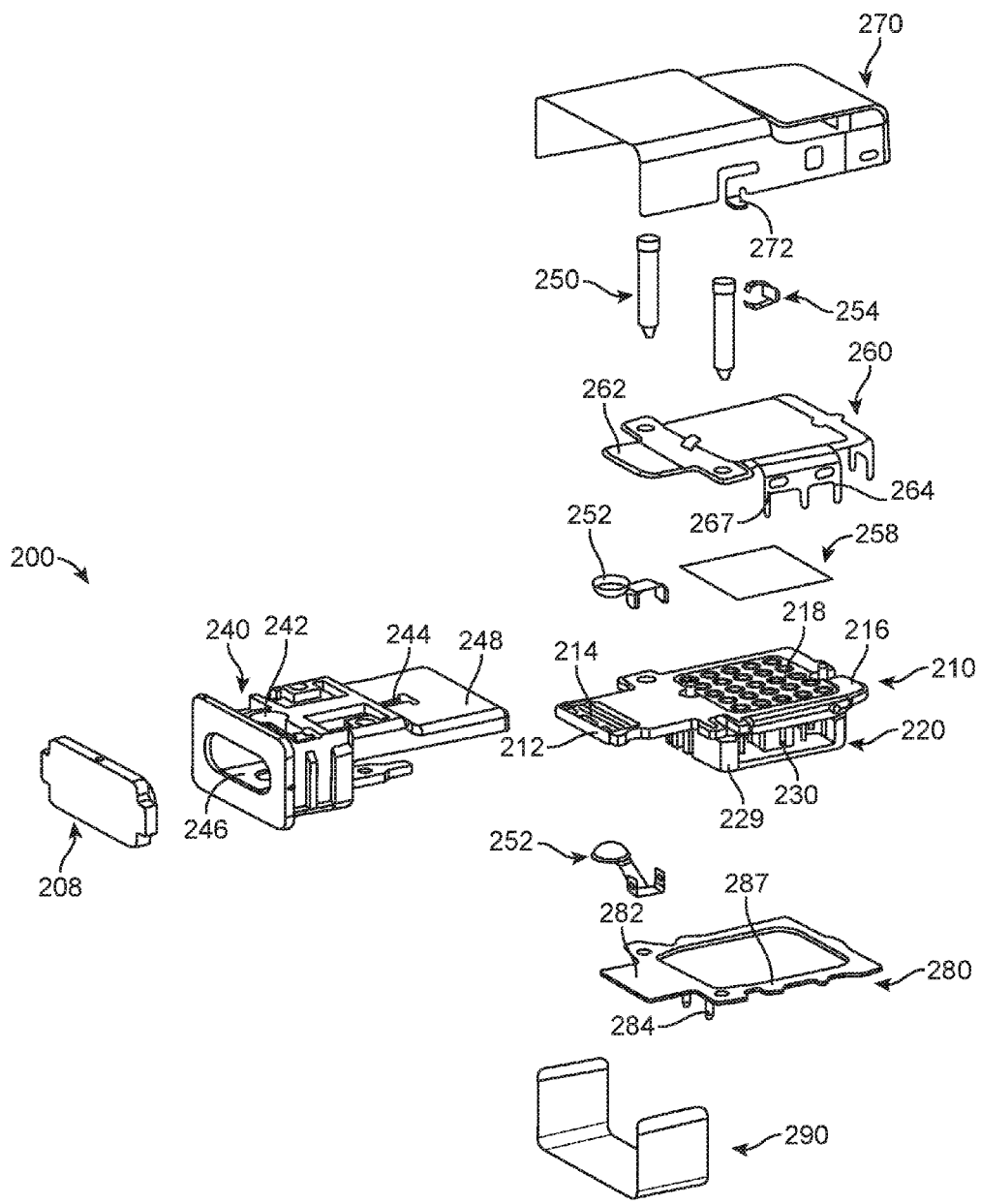
FIG. 3 illustrates an exploded view of a connector receptacle according to an embodiment of the present invention.

FIG. 3 illustrates an exploded view of a connector receptacle according to an embodiment of the present invention. Connector receptacle 200 may include printed circuit board 210. Printed circuit board 210 may be a multi-layer or other type of printed circuit board Printed circuit board 210 may include tongue 212 supporting contacts 214. Contacts 214 may be located on a top side of printed circuit board 210, on a bottom side of printed circuit board 210, or both. Printed circuit board 210 may further include a rear portion 216 having a number of openings 218. Traces (not shown), may extend from contacts 214 to openings 218. Utilizing printed circuit board 210 for routing through connector receptacle 200 may provide contacts 214 and traces (not shown) having high impedances, matched impedances, and shielding for a high signal quality or signal integrity. In these and other embodiments of the present invention, one or more electronic devices or components (not shown), such as data retiming circuits, impedance circuits, light-emitting diodes, and others may be located on printed circuit board 210 and may be connected to contacts 214 and openings 218 via traces (not shown) in printed circuit board 210.

Through-hole contacting portions 230 may be soldered into openings 218 in printed circuit board 210. Through-hole contacting portions 230 may be arranged to be inserted and soldered to openings in logic board 2110 (shown in FIG. 21), which may be a printed circuit board (separate from printed circuit board 210 in connector receptacle 200), flexible circuit board, or other appropriate substrate. Header 220 may provide mechanical support for through-hole contacting portions 230. The use of through-hole contacting portions 230 that are reflow soldered to printed circuit board 210 and stabilized by header 220 may contribute to a connector receptacle 200 that is reliable and durable. Reflow cap 229 may be positioned under header 220. Reflow cap 229 may protect through-hole contacting portions 230 from damage during assembly and shipping of connector receptacle 200. Reflow cap 229 may secure through-hole contacting portions 230 in position during reflow soldering when through-hole contacting portions 230 are soldered to printed circuit board 210. Reflow cap 229 may also protect against overheating and discoloration during reflow.

Insulator 258 may be used to electrically insulate through-hole contacting portions 230 and openings 218 from EMI top plate 260. EMI top plate 260 may be placed over printed circuit board 210 and insulator 258. EMI top plate 260 may include ground contact 262 and ground tabs 264. EMI bottom plate 280 may be placed under printed circuit board 210. EMI bottom plate 280 may include ground contact 282 and ground tabs 284. EMI bottom plate 280 may include tabs 287 that may be inserted into openings 267 in EMI top plate 260. In this way, EMI bottom plate 280 and EMI top plate 260 may snap together during assembly to form an electrical connection. Ground contacts 262 and 282 may electrically connect to ground contacts at a front of a connector insert (not shown) when the connector insert is inserted into connector receptacle 200. Ground tabs 264 and 284 may be inserted into openings in logic board 2110 (shown in FIG. 21).

These connector receptacle structures may be aligned by pins 250 to housing 240. Specifically, EMI top plate 260, printed circuit board 210, and EMI bottom plate 280 may be aligned by pins 250 to housing 240. Housing 240 may include opening 246. Printed circuit board 210 may be placed under extension 248 of housing 240 such that tongue 212 of printed circuit board 210 may be located in opening 246 of housing 240. Ground contacts 252 may be placed in openings 242 and housing 240. Ground clip 254 may be placed in slot 244 in housing 240.

Bottom shield 290 may be placed under a bottom side of housing 240, while top shield 270 may be placed over a top side of housing 240. In various embodiments of the present invention, top shield 270 and bottom shield 290 may snap together.

Reflow cap 208 may be inserted into opening 246 of housing 240. Reflow cap 208 may protect tongue 212 from damage, corrosion, contamination, and oxidation during assembly and shipping of connector receptacle 200. Reflow cap 208 may also protect tongue 212 from overheating and discoloration when connector receptacle 200 is soldered to logic board 2110 (shown in FIG. 21).

In this way, a shield of a connector insert (not shown) that is inserted into connector receptacle 200 may electrically connect to ground contacts 252 on a top and bottom of opening 246. Ground contacts in the front of the connector insert may electrically connect to the shield of the connector insert and may further electrically connect to ground contact 262 on EMI top plate 260 and ground contact 282 on EMI bottom plate 280. Ground clip 254 may electrically connect EMI top plate 260 to top shield 270.

In various embodiments of the present invention, ground contact 262 on EMI top plate 260 may be biased in downward direction such that ground contact 262 may remain physically close to a top surface of printed circuit board 210. Similarly, ground contact 282 on EMI bottom plate 280 may be biased in an upward direction such that ground contact 282 may remain physically close to a bottom surface of printed circuit board 210.

Figure 21:
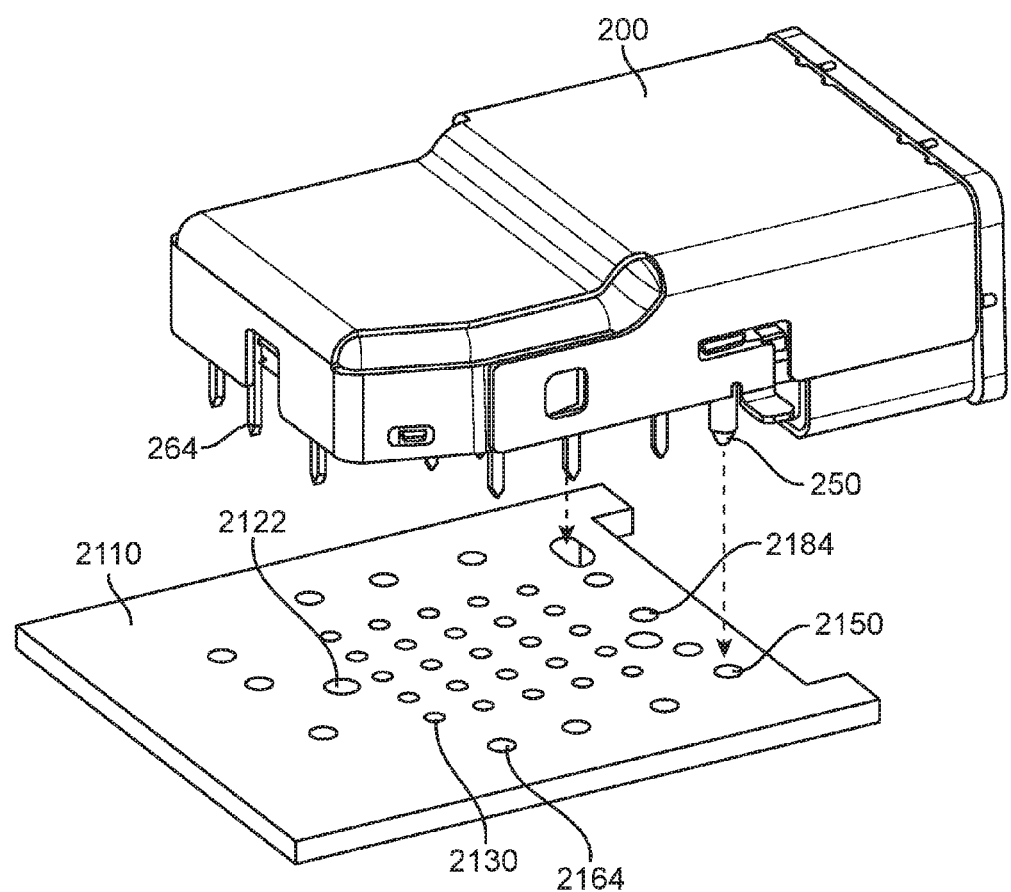
FIG. 21 illustrates the attachment of a connector receptacle to a logic board according to an embodiment of the present invention.

In this example, traces (not shown) in printed circuit board 210 and through-hole contacting portions 230 may provide pathways for signals and power from a connector insert (not shown) that is inserted into connector receptacle 200 and logic board 2110 (shown in FIG. 21). The use of through-hole contacting portions 230 that are reflow soldered to printed circuit board 210 and supported by header 220 may form a reliable and durable connector receptacle 200. Examples of this portion of connector receptacle 200 are shown in the following figures.

Figure 4:
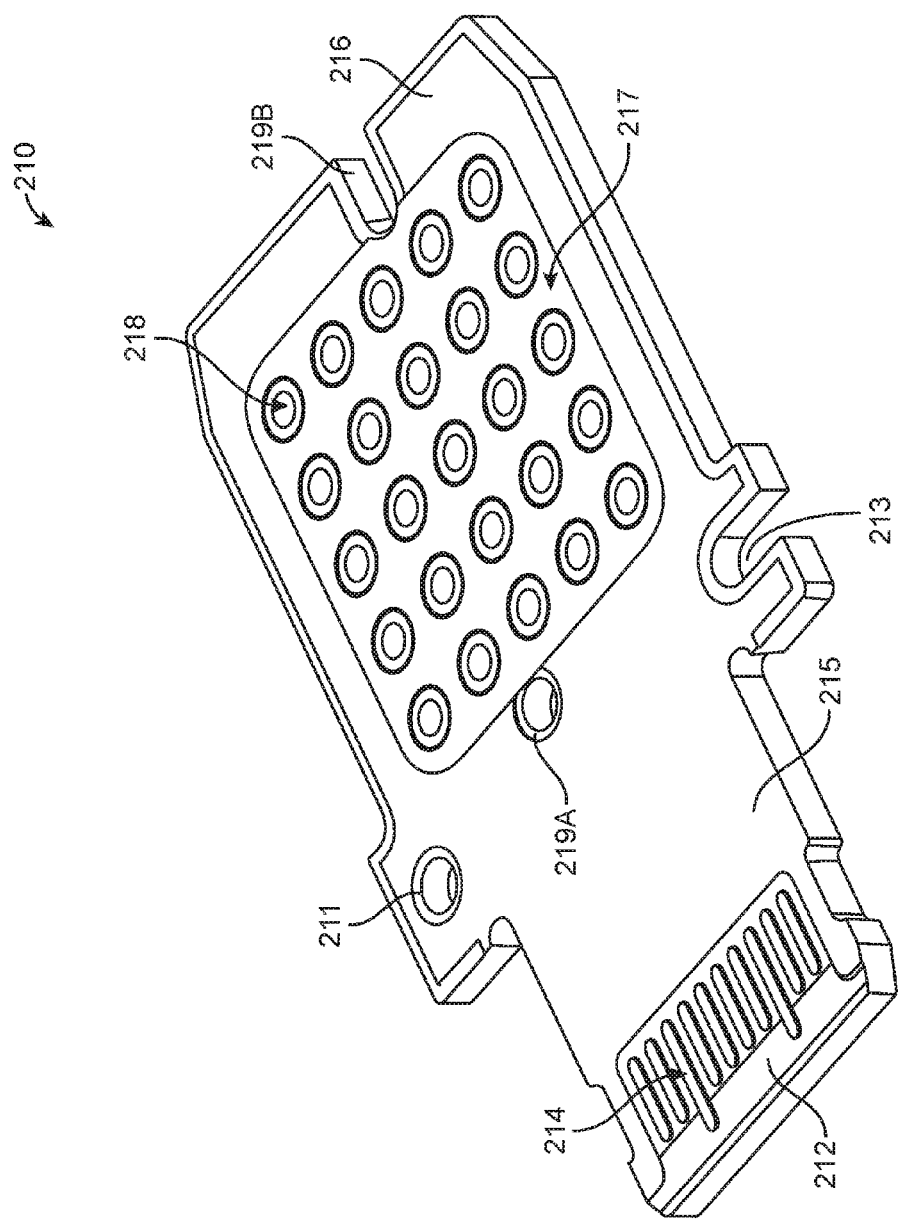
FIG. 4 illustrates a printed circuit board for a connector receptacle according to an embodiment of the present invention.

FIG. 4 illustrates a printed circuit board for a connector receptacle according to an embodiment of the present invention. Printed circuit board 210 may include tongue 212 supporting a number of contacts 214. Contacts 214 may be located on a top side of printed circuit board 210, on the bottom side of printed circuit board 210, or both. Top and bottom sides of printed circuit board 210 may be plated with a ground ring or ground area 215. Tongue 210 may further include a rear portion 216. Opening 217 in ground ring or ground area 215 may be provided on rear portion 216 of printed circuit board 210. A number of openings 218 may be plated for connection to through-hole contacting portions 230 (shown in FIG. 3). Printed circuit board 210 may include alignment opening 211 and alignment notch 213 for accepting pins 250 (shown in FIG. 9). Using alignment opening 211 and alignment notch 213 allows tolerances in a size of printed circuit board 210 to be compensated for while still being able to align printed circuit board 210 to other portions of connector receptacle 200 (shown in FIG. 2). Printed circuit board 210 may further include opening 219A and notch 219B for accepting posts 224 of header 220 (shown in FIG. 5). Traces (not shown), may extend from contacts 214 to openings 218. Utilizing printed circuit board 210 for routing through connector receptacle 200 may provide contacts and traces having high impedances, matched impedances, and shielding for a high signal quality or signal integrity.

In these and other embodiments of the present invention, one or more electronic devices or components (not shown), such as data retiming circuits, impedance circuits, light-emitting diodes, and others, may be located on printed circuit board 210. These devices or components may be connected to contacts 214 and openings 218 through traces in printed circuit board 210.

Figure 5:
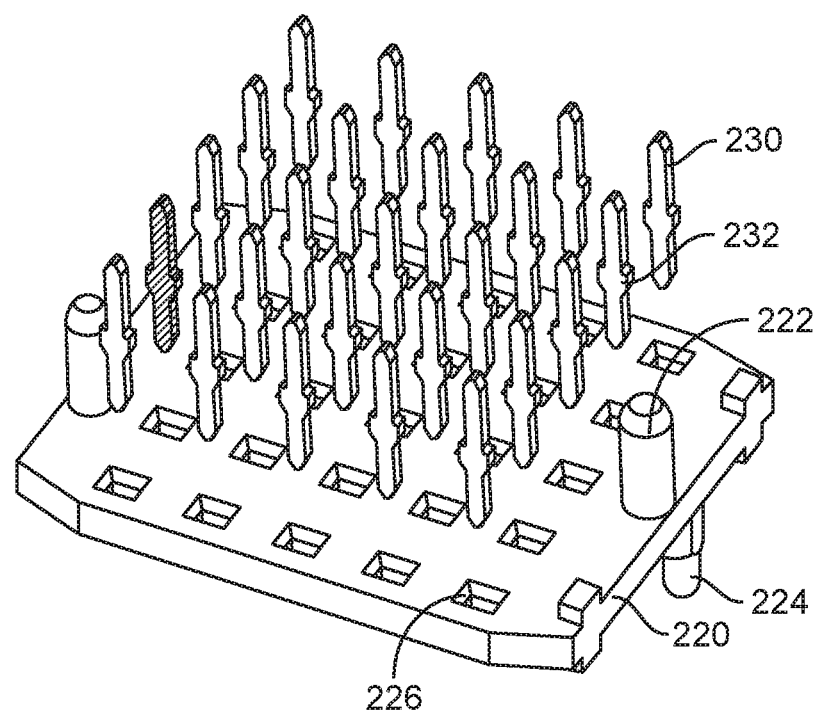
FIG. 5 illustrates a portion of a connector receptacle according to an embodiment of the present invention.

FIG. 5 illustrates a portion of a connector receptacle according to an embodiment of the present invention. Header 220 may include a number of openings 226, each for accepting a through-hole contacting portion 230. Through-hole contacting portions 230 may include barbs 232 for securing through-hole contacting portions 230 in place in openings 226 in header 220. Posts 222 may emerge from a bottom of connector receptacle 200 (shown in FIG. 2) and may be inserted into openings in logic board 2110 (shown in FIG. 21) for mechanical stability. Posts 224 may be inserted into opening 219A and notch 219B of printed circuit board 210 (shown in FIG. 4).

Figure 6:
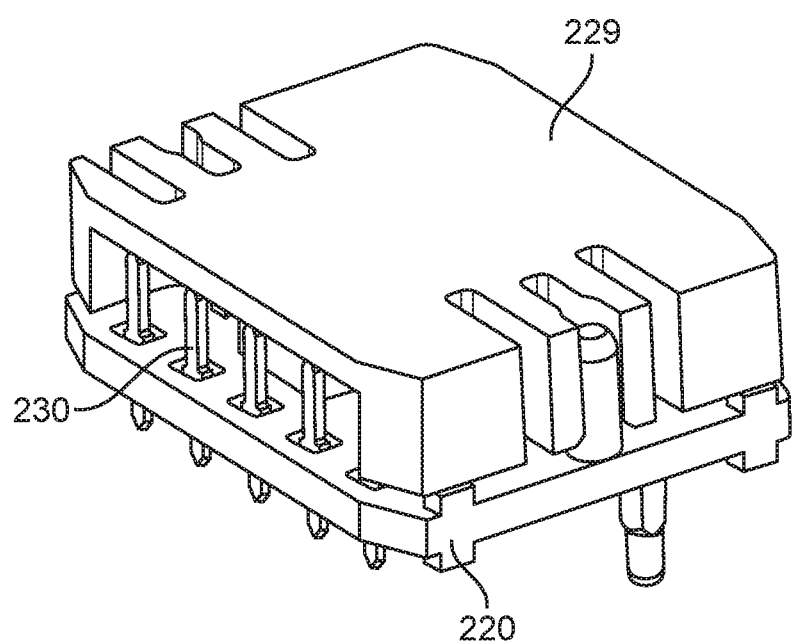
FIG. 6 illustrates another portion of a connector receptacle according to an embodiment of the present invention.

FIG. 6 illustrates another portion of a connector receptacle according to an embodiment of the present invention. In this figure, through-hole contacting portions 230 may be inserted into header 220. Reflow cap 229 may be placed over header 220 in order help keep through-hole contacting portions 230 in place during reflow soldering when through-hole contacting portions 230 are soldered to printed circuit board 210 (shown in FIG. 3). Reflow cap 229 may further protect through-hole contacting portions 230 from over-heating during soldering and damage during assembly and shipping of connector receptacle 200 (shown in FIG. 2).

Figure 7:
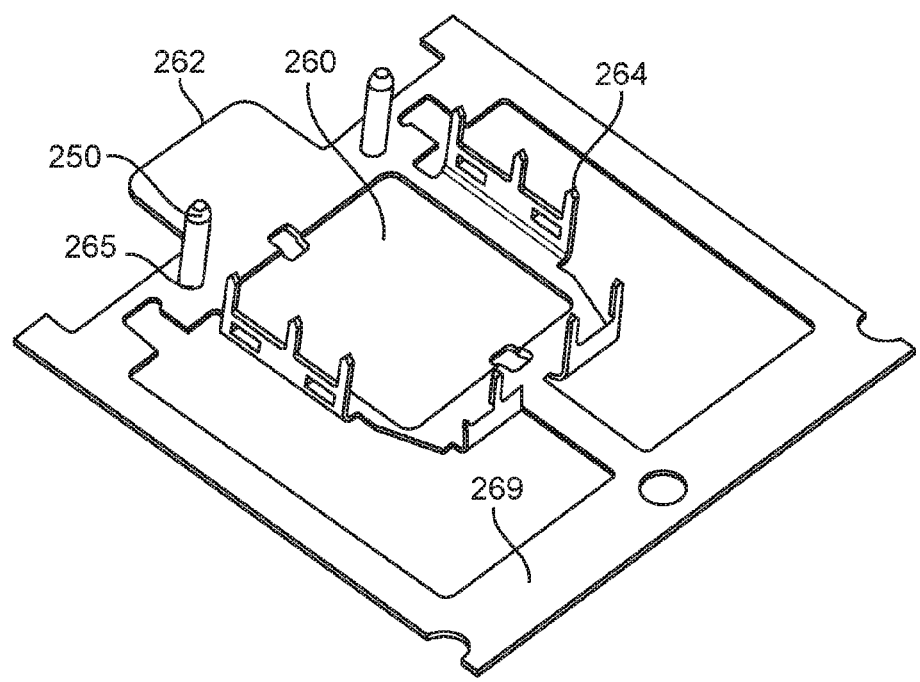
FIGS. 7-20 illustrate a method of manufacturing a connector receptacle according to an embodiment of the present invention.
Figure 8:
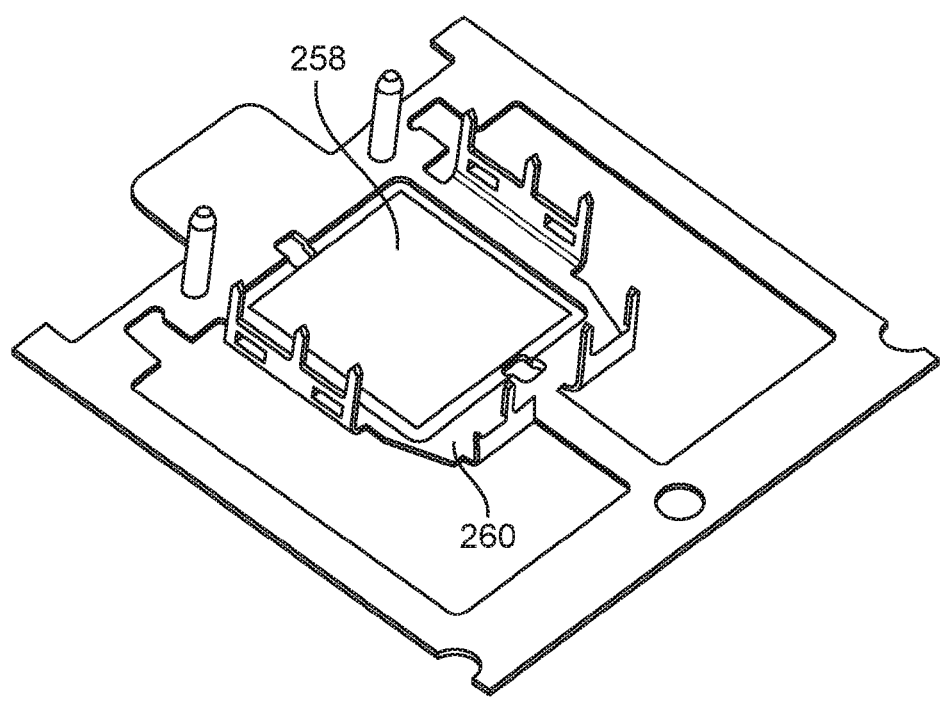
Figure 9:
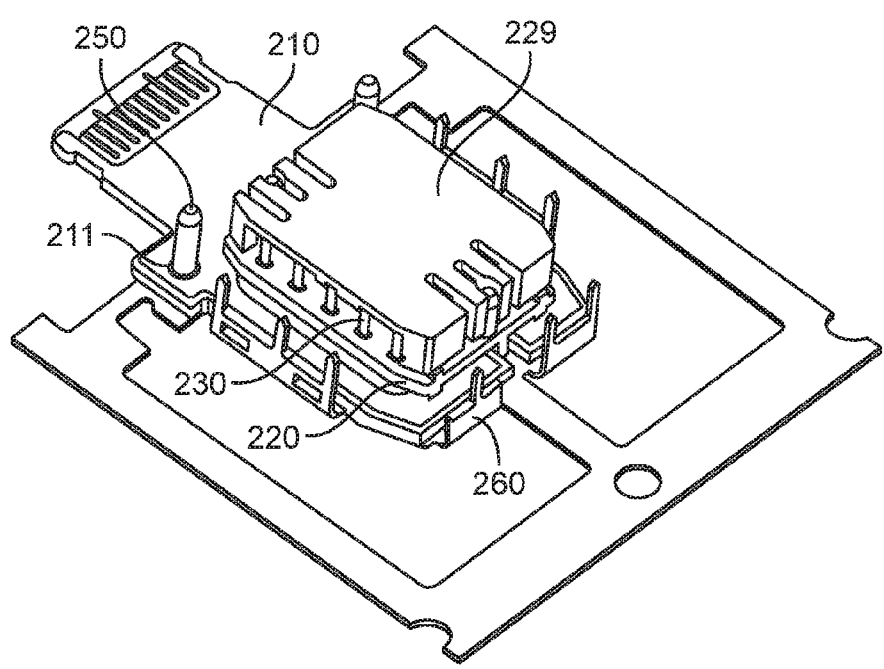
Figure 10:
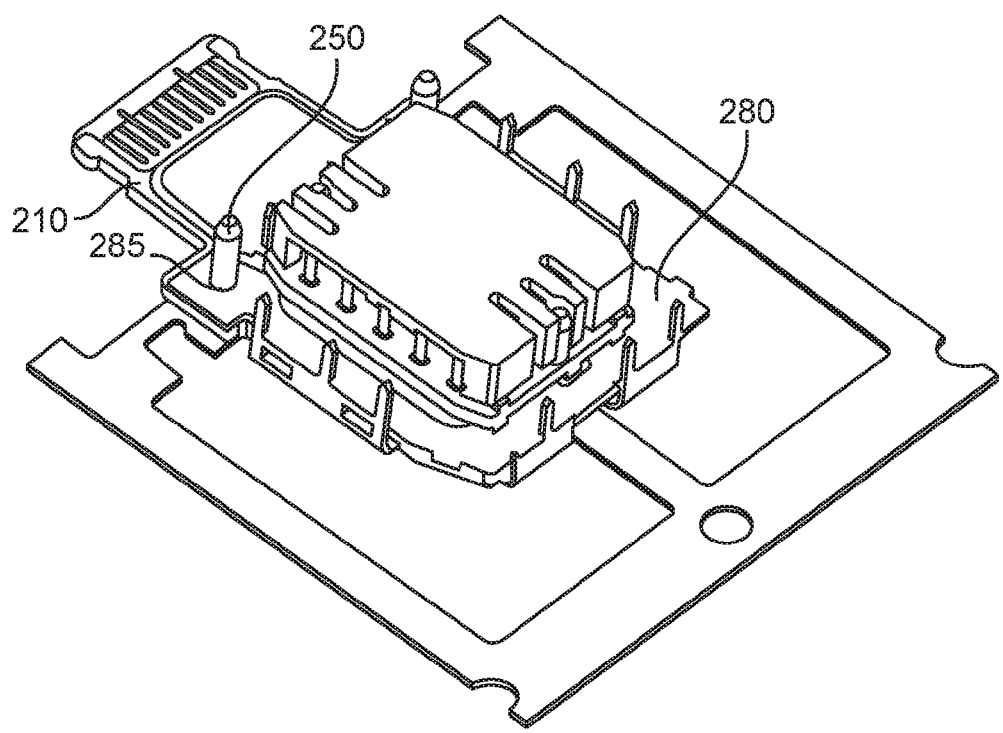
Figure 11:
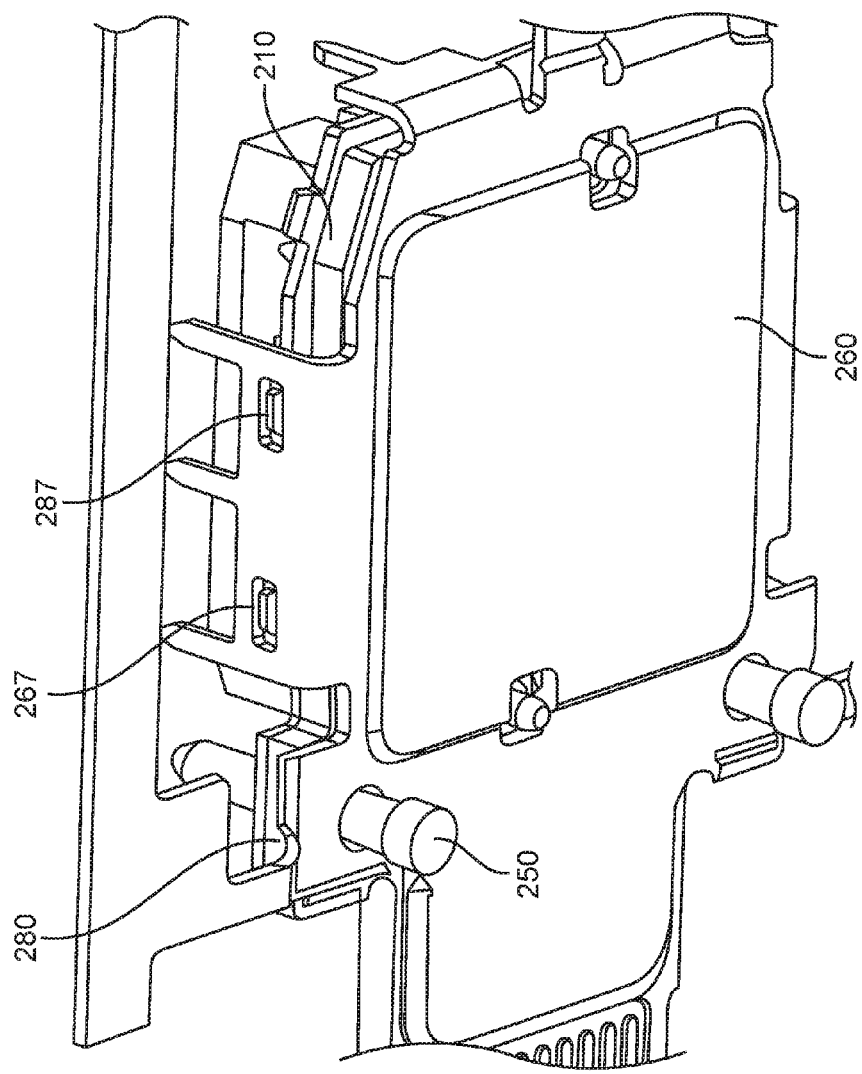

FIGS. 7-20 illustrate a method of manufacturing a connector receptacle according to an embodiment of the present invention. In FIG. 7, alignment pins 250 may be inserted into corresponding openings 265 in EMI top plate 260. EMI top plate 260 may include ground contact 262 and ground tabs 264. Carrier 269 may be stamped as part of EMI top plate 260 so that connector receptacle 200 may be more easily handled during manufacturing. In FIG. 8, insulating layer 258 may be placed on an underside of EMI top plate 260. In FIG. 9, the assembled unit from FIG. 6 may be soldered to printed circuit board 210, and printed circuit board 210 and the assembled unit from FIG. 6 may be placed on EMI top plate 260. Specifically, through-hole contacting portions 230, which may be held in place by header 220, may be soldered to openings 218 (shown in FIG. 4) of printed circuit board 210. Again, reflow cap 229 may secure through-hole contacting portions 230 in place during reflow and prevent overheating. Alignment opening 211 and alignment notch 213 (shown in FIG. 4) in printed circuit board 210 may accept pins 250 to align tongue 210 to EMI top plate 260. In FIG. 10, EMI bottom plate 280 may be placed on a bottom surface of printed circuit board 210. Pins 250 may pass through openings 285 in EMI bottom plate 280. FIG. 11 illustrates a close-up side view of pins 250 passing through EMI top plate 260, printed circuit board 210, and EMI bottom plate 280. Also, tabs 287 on EMI bottom plate 280 are shown inserted in openings 267 in EMI top plate 260.

Figure 12:
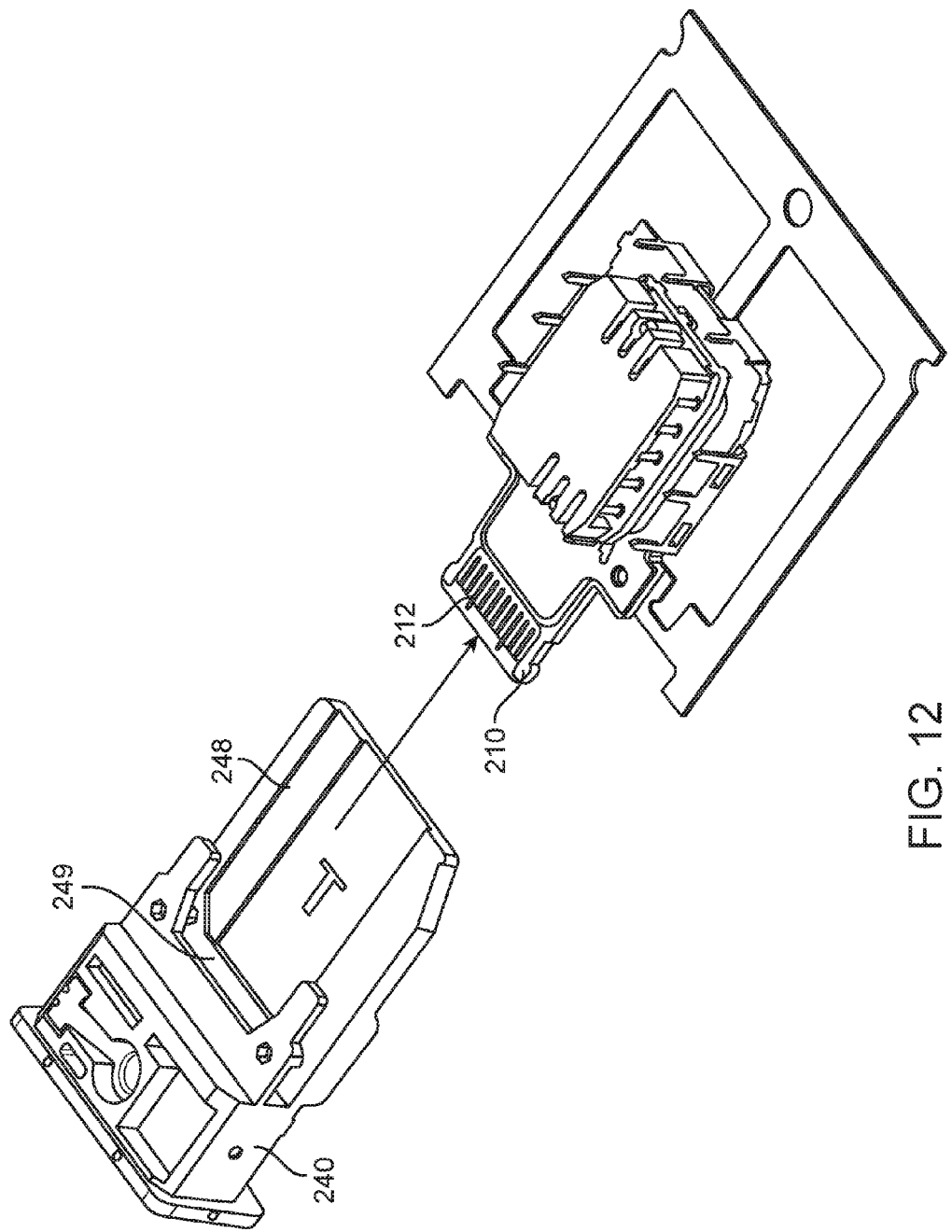
Figure 13:
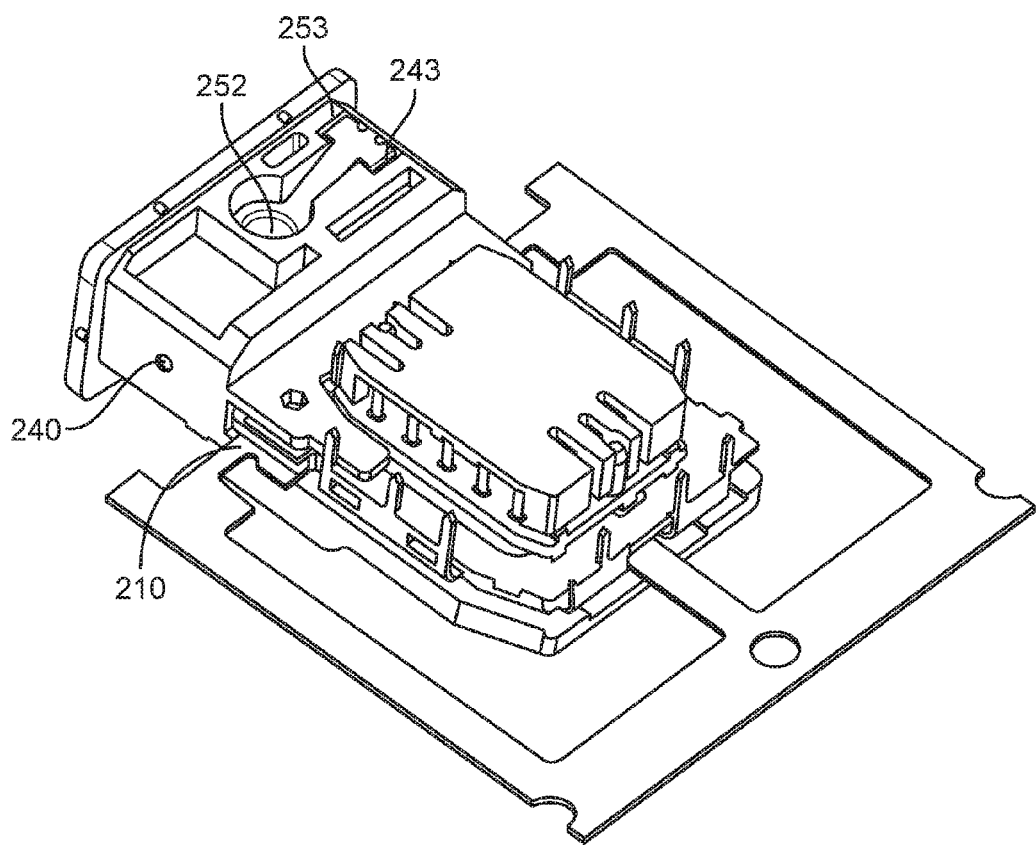

In FIG. 12, housing 240 may be placed over printed circuit board 210. Specifically, extended portion 248 of housing 240 may be placed over a top side of printed circuit board 210. To facilitate this, pins 250 may be removed. Tongue 212 of printed circuit board 210 may pass through an opening 249 in housing 240. In FIG. 13, printed circuit board 210 may be in its final position relative to housing 240. Ground contact 252 may be located in an opening 242 (shown in FIG. 3) in housing 240. Tabs 253 on ground contact 252 may be placed in notches 243 in housing 240.

Figure 14:
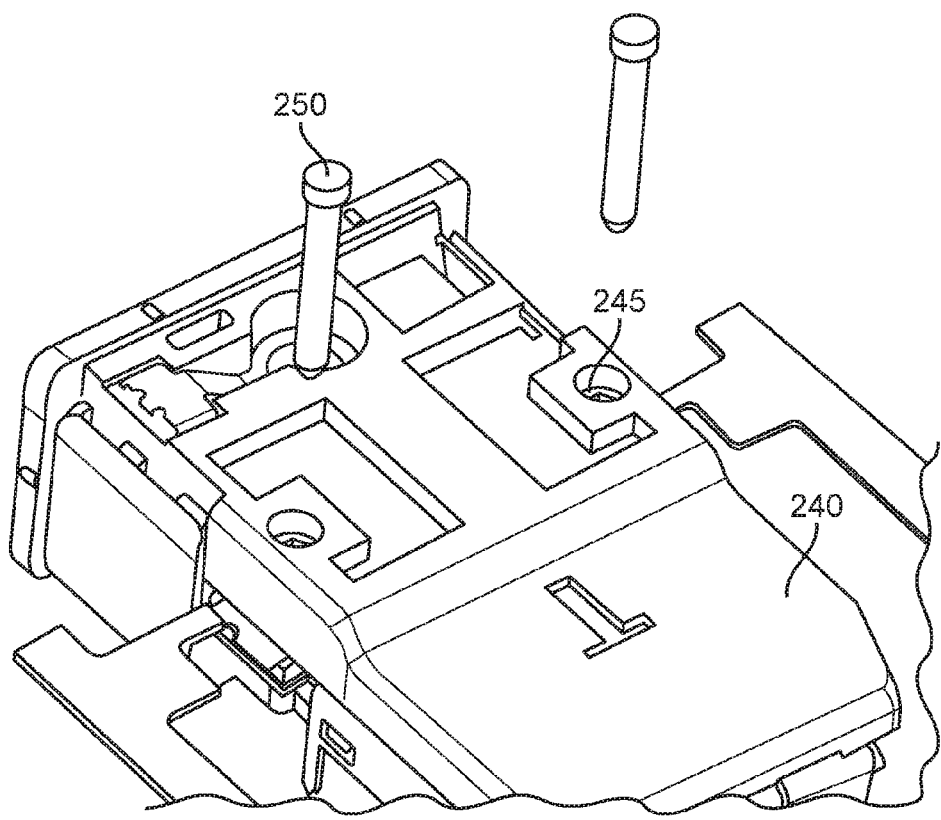
Figure 15:
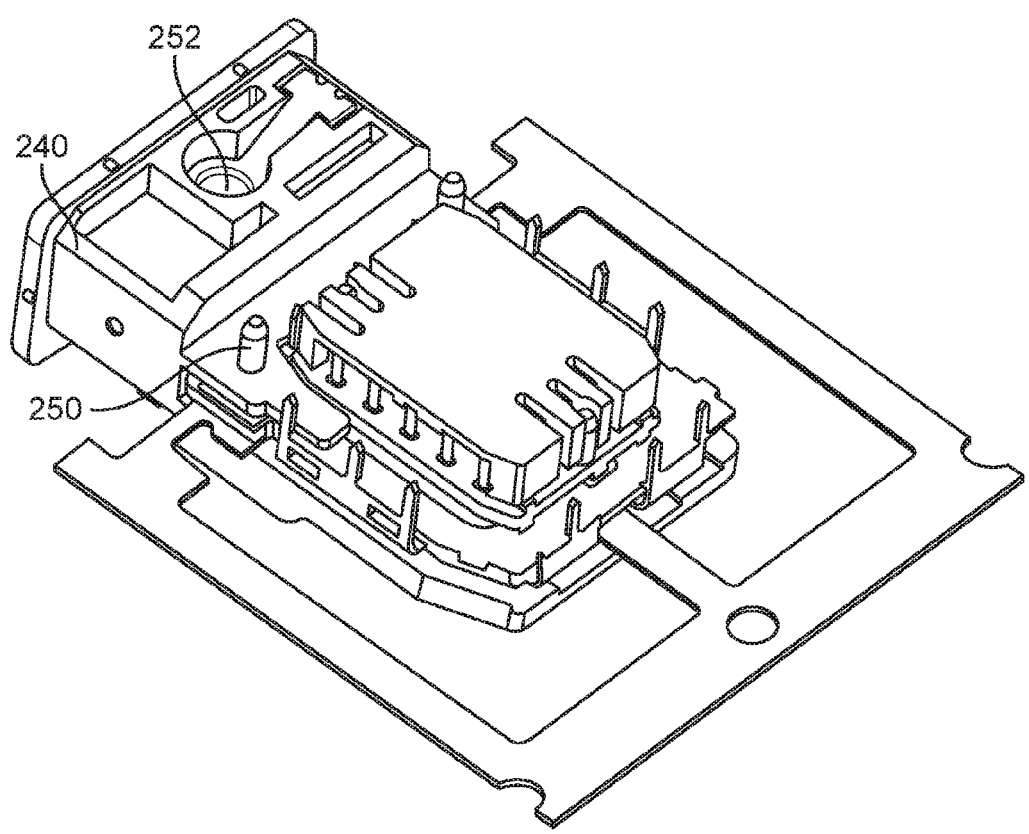
Figure 16:
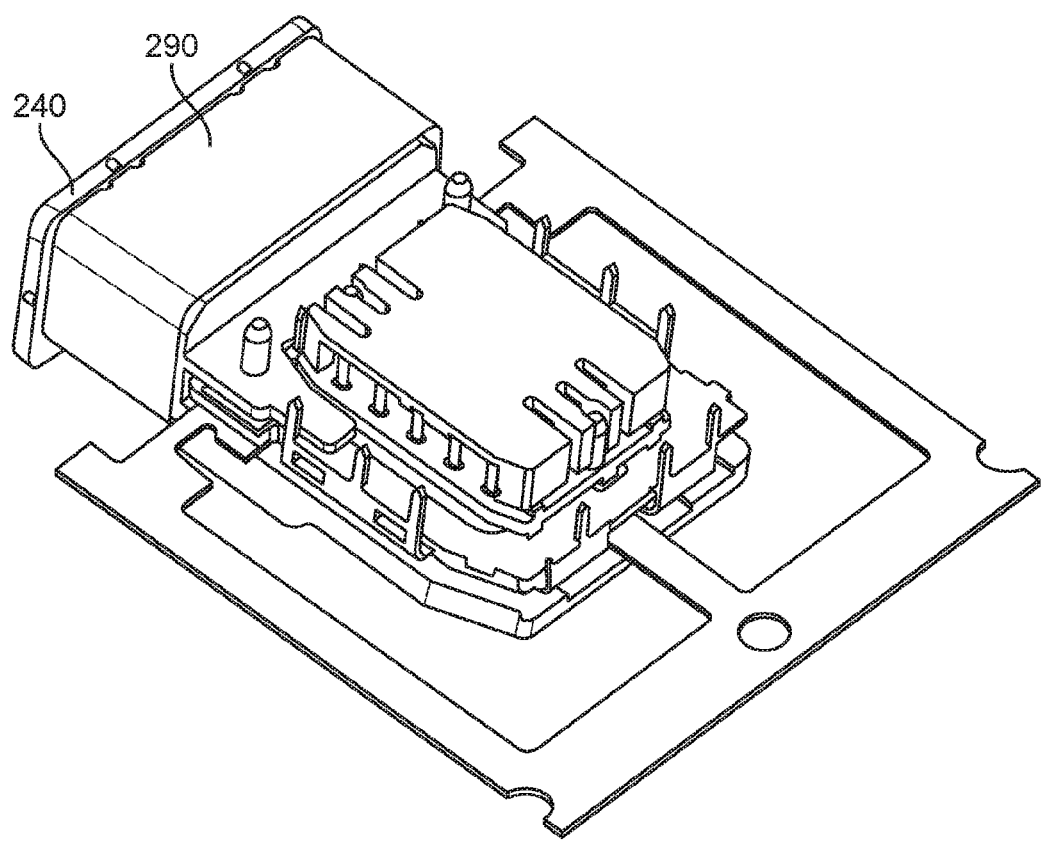
Figure 17:
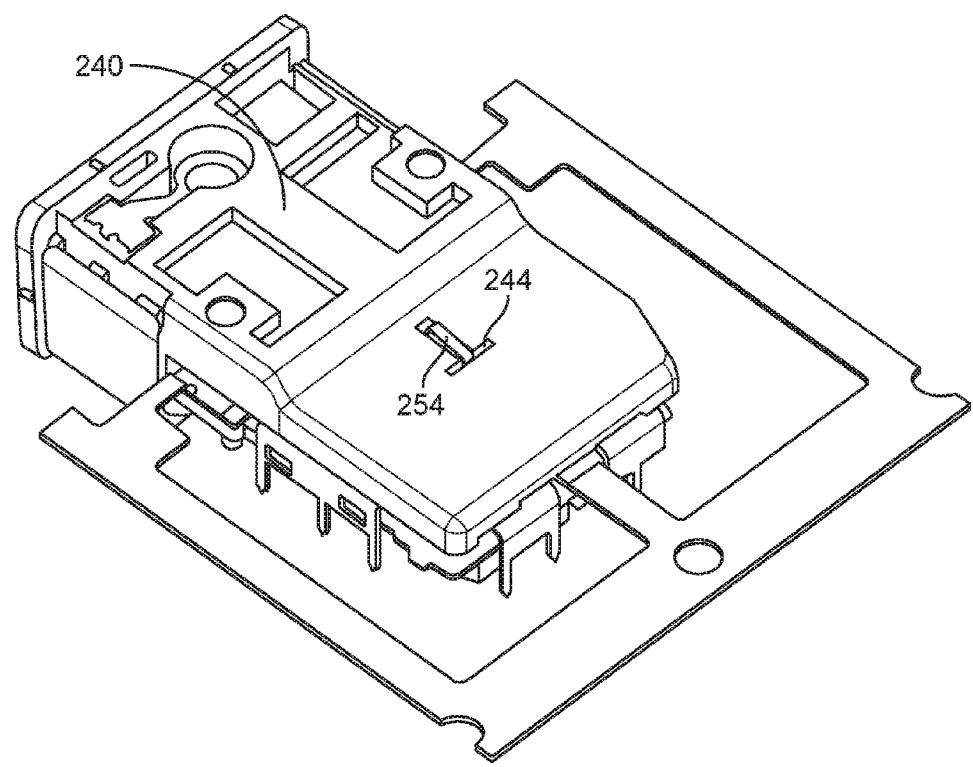
Figure 18:
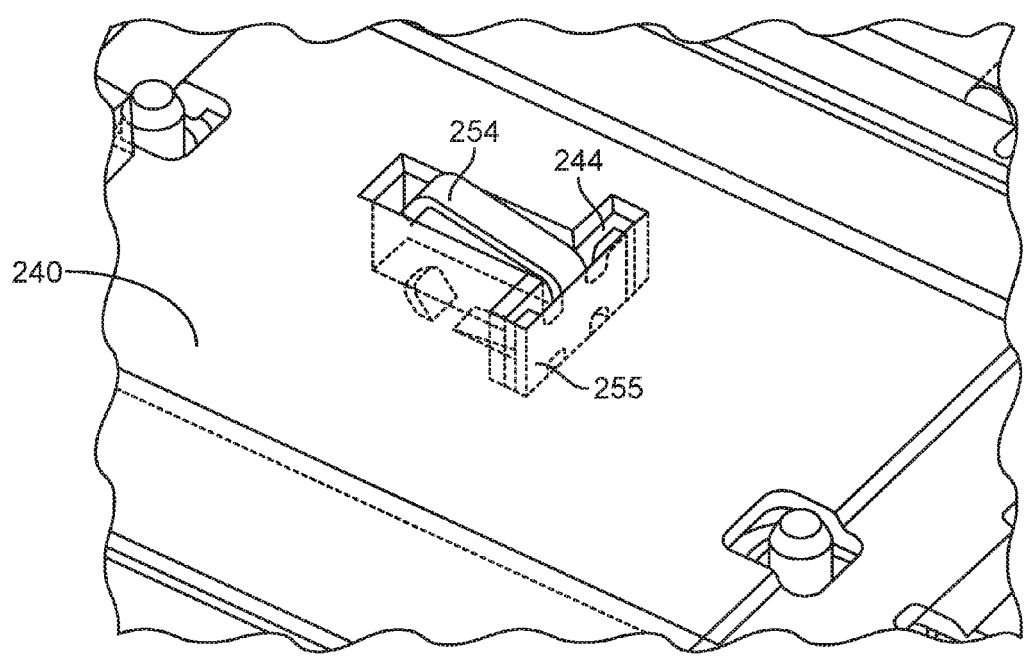
Figure 19:
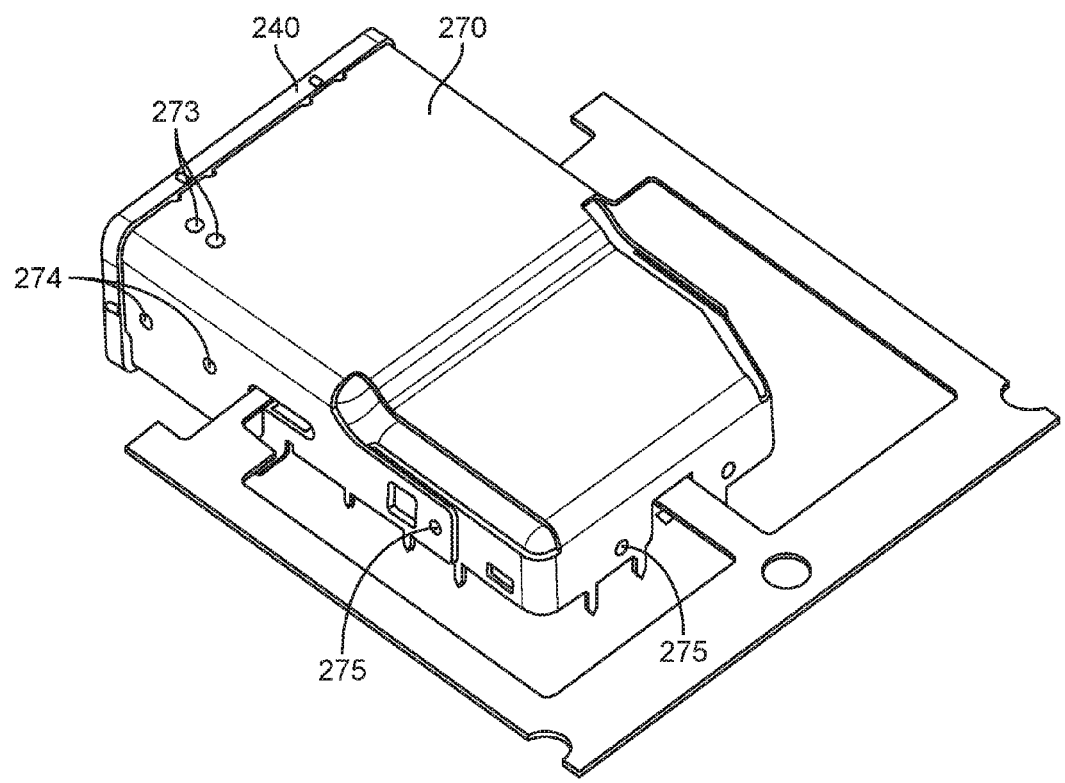
Figure 20:
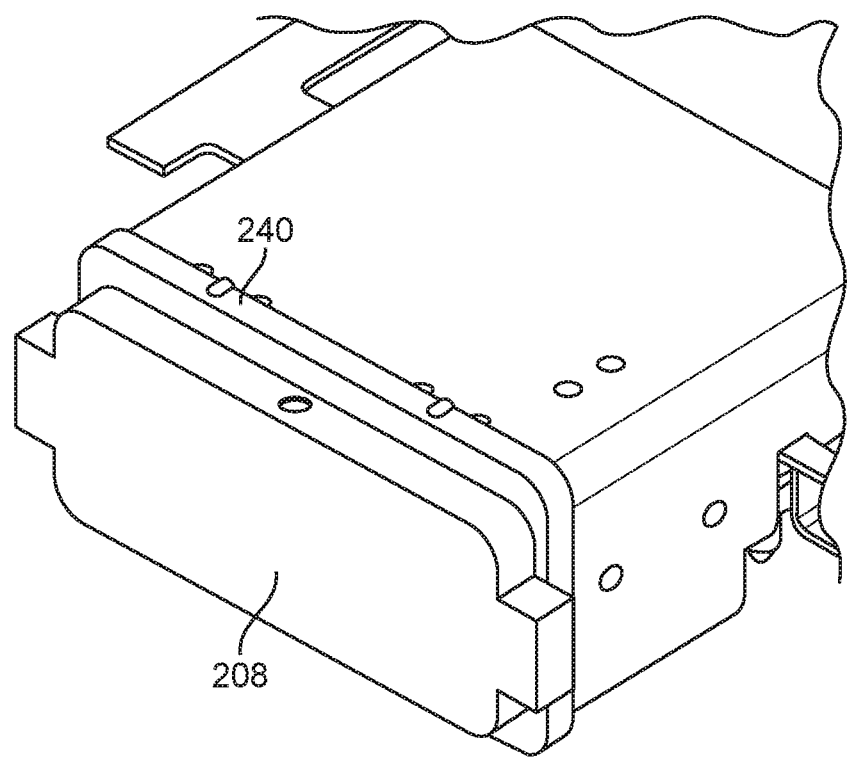

In FIG. 14, pins 250 may be reinserted into openings 245 in housing 240. FIG. 15 illustrates pins 250 and ground contact 252 in housing 240. In FIG. 16, bottom shield 290 may be placed over a bottom side of housing 240. In FIG. 17, ground clip 254 may be placed in an opening 244 in housing 240. FIG. 18 illustrates a close-up view of ground clip 254. Ground clip 254 may include tabs 255 which may be placed in notches in opening 244 in housing 240. In FIG. 19, top shield 270 may be placed over the top side of housing 240. Top shield 270 may be spot or laser welded at points 273 to ground contact 253 (shown in FIG. 15). Top shield 270 may be spot or laser welded to bottom shield 290 (shown in FIG. 16) at points 274. Top shield 270 may be spot or laser welded at points 275 to EMI top plate 260 (shown in FIG. 7). In FIG. 20, reflow cap 208 may be placed in opening 246 (shown in FIG. 2) in housing 240.

FIG. 21 illustrates the attachment of a connector receptacle to a logic board according to an embodiment of the present invention. Connector receptacle 200 may be attached to a top side of logic board 2110, which may be a printed circuit board, flexible circuit board, or other appropriate substrate. Logic board 2110 may include openings 2150 for pins 250. Openings 2150 may be grounded. Logic board 2110 may include openings 2122 for posts 222 on header 220 (shown in FIG. 5.) Logic board 2110 may further include openings 2130 for accepting through-hole contacting portions 230 (shown in FIG. 2) of connector receptacle 200. Openings 2130 may connect to traces in logic board 2110. Logic board 2110 may further include openings 2164 and 2184 for accepting ground tabs 264 and 284 (shown in FIG. 2) on EMI top plate 260 and EMI bottom plate 280. Openings 2164 and 2184 may be grounded.

Figure 22:
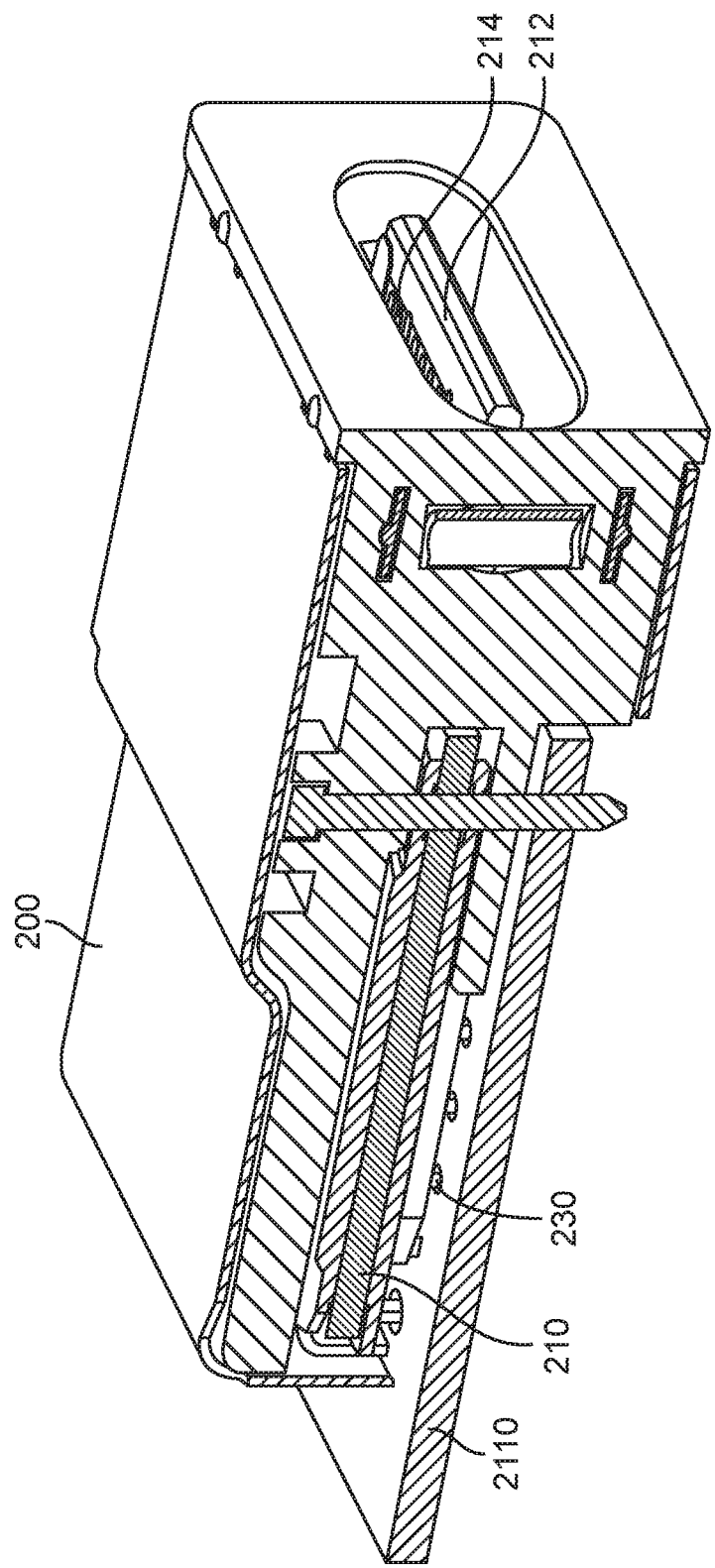
FIG. 22 illustrates a cutaway side view of a connector receptacle attached to a logic board according to an embodiment of the present invention.

FIG. 22 illustrates a cutaway side view of a connector receptacle attached to a logic board according to an embodiment of the present invention. As shown, printed circuit board 210 in connector receptacle 200 may be vertically displaced from logic board 2110. This vertical displacement may help to properly align connector receptacle opening 246 (identified in FIG. 2) to a corresponding opening in a device enclosure (not shown).

In these and other embodiments of the present invention, each contact 214 on a tongue 212 of a connector receptacle 200 may be independently electrically connected to a through-hole contacting portion 230. Using a through-hole contacting portion 230 for each contact 214 may facilitate inspection during assembly as each through-hole contacting portion 230 may be readily viewed and examined after soldering to logic board 2110. Also, electrical testing may be simplified as each contact 214 may be electrically connected to a separate through-hole contacting portion 230.

In these and other embodiments of the present invention, contacts 214 may be connected to through-hole contacting portions 230. Through-hole contacting portions 230 may fit in openings in logic board 2110 to form electrical connections with traces (not shown) in logic board 2110. These through-hole contacting portions 230 may also provide mechanical stability for the receptacle 200. In other embodiments of the present invention, some or all of contacts 214 may terminate in surface-mount contacting portions (not shown).

While embodiments of the present invention may be useful in USB Type-C connector receptacles, these and other embodiments of the present invention may be used in other types of connector receptacles for different interfaces.

In various embodiments of the present invention, shields, EMI plates, ground contacts, ground clips, through-hole contacting portions, and other conductive portions of a connector receptacle may be formed by stamping, metal-injection molding, machining, micro-machining, 3-D printing, or other manufacturing process. The conductive portions may be formed of stainless steel, steel, copper, titanium copper, phosphor bronze, or other material or combination of materials. They may be plated or coated with nickel, gold, or other material. The nonconductive portions, such as the housings, headers, reflow caps, and other structures may be formed using injection or other molding, 3-D printing, machining, or other manufacturing process. The nonconductive portions may be formed of silicon or silicone, rubber, hard rubber, plastic, nylon, liquid-crystal polymers (LCPs), ceramics, or other nonconductive material or combination of materials. The printed circuit boards used may be formed of FR-4 or other material.

Embodiments of the present invention may provide connector receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, adapters, remote control devices, chargers, and other devices. These connector receptacles may provide interconnect pathways for signals that are compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention may provide connector receptacles that may be used to provide a reduced set of functions for one or more of these standards. In various embodiments of the present invention, these interconnect paths provided by these connector receptacles may be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector receptacle comprising:
    a tongue formed of a printed circuit board;
    an EMI top plate over the printed circuit board;
    an EMI bottom plate under the printed circuit board;
    a housing around the tongue;
    a plurality of contacts on the tongue;
    a first alignment pin passing through a first opening in the housing, a first opening in the EMI top plate, a first opening in the EMI bottom plate, and a first opening in the printed circuit board;
    a second alignment pin passing through a second opening in the housing, a second opening in the EMI top plate, a second opening in the EMI bottom plate, and a second opening in the printed circuit board; and
    a plurality of through-hole contacting portions, each connected to a corresponding contact in the plurality of contacts on the tongue.

2. The connector receptacle of claim 1 wherein the printed circuit board is a multi-layer printed circuit board.

3. The connector receptacle of claim 2 where the housing has a front opening for the tongue.

4. The connector receptacle of claim 3 further comprising a top shield over a top of the housing and a bottom shield under a bottom of the housing.

5. The connector receptacle of claim 4 wherein the plurality of through-hole contacting portions comprise a plurality of pins soldered to an underside of the printed circuit board.

6. The connector receptacle of claim 5 further comprising a header to support the plurality of through-hole contacting portions.

7. The connector receptacle of claim 1 wherein the EMI bottom plate includes tabs to fit in openings in EMI top plate.

8. The connector receptacle of claim 1 wherein the connector receptacle is modular.

9. The connector receptacle of claim 1 wherein the first opening in the printed circuit board is a hole and the second opening in the printed circuit board is a notch.

10. A connector receptacle comprising:
a tongue formed of a front portion of a printed circuit board, the printed circuit board further having a rear portion, a first opening, and a second opening;
an EMI top plate over the printed circuit board and having a first opening and a second opening;
an EMI bottom plate under the printed circuit board and having a first opening and a second opening;
a housing around the tongue, the housing having a first opening and a second opening;
a plurality of contacts on the tongue;
a plurality of third openings in the rear portion of the printed circuit board;
a first alignment pin passing through the first opening in the housing, the first opening in the EMI top plate, the first opening in the EMI bottom plate, and the first opening in the printed circuit board;
a second alignment pin passing through the second opening in the housing, the second opening in the EMI top plate, the second opening in the EMI bottom plate, and the second opening in the printed circuit board; and
a plurality of through-hole contacting portions, each connected to the printed circuit board at a corresponding opening in the plurality of third openings in the rear portion of the printed circuit board.

11. The connector receptacle of claim 10 further comprising a header to support the plurality of through-hole contacting portions.

12. The connector receptacle of claim 11 wherein the printed circuit board is a multi-layer printed circuit board.

13. The connector receptacle of claim 12 wherein the printed circuit board comprises a plurality of traces, each trace connecting one of the plurality of contacts on the tongue of the printed circuit board to one of the plurality of third openings in the rear portion of the printed circuit board.

14. The connector receptacle of claim 10 wherein the connector receptacle is modular.

15. The connector receptacle of claim 10 wherein the first opening in the printed circuit board is a hole and the second opening in the printed circuit board is a notch.

16. A connector receptacle comprising:
a tongue supporting a plurality of contacts and formed of a front portion of a printed circuit board, the printed circuit board further having a rear portion, a first opening, a second opening, and a plurality of third openings in the rear portion;
an EMI top plate over the rear portion of the printed circuit board and having a first opening and a second opening;
an EMI bottom plate under the rear portion of the printed circuit board and having a first opening and a second opening;
a housing around the tongue, the housing extending over the EMI top plate and the rear portion of the printed circuit board and having a first opening and a second opening;
a plurality of contacts on the tongue;
a first alignment pin passing through the first opening in the housing, the first opening in the EMI top plate, the first opening in the EMI bottom plate, and the first opening in the printed circuit board;
a second alignment pin passing through the second opening in the housing, the second opening in the EMI top plate, the second opening in the EMI bottom plate, and the second opening in the printed circuit board; and
a plurality of through-hole contacting portions, each connected to the printed circuit board at a corresponding opening in the plurality of third openings in the rear portion of the printed circuit board,
wherein the connector receptacle is a modular connector receptacle.

17. The connector receptacle of claim 16 wherein the connector receptacle provides signal paths between a connector insert and a logic board.

18. The connector receptacle of claim 16 wherein the plurality of through-hole contacting portions are supported by a header.

19. The connector receptacle of claim 16, wherein the modular connector receptacle provides pathways from a corresponding connector insert to a logic board of an electronic device when the corresponding connector insert is mated with the connector receptacle, and comprises a housing having an opening for the corresponding connector insert.

20. The connector receptacle of claim 16 wherein the first opening in the printed circuit board is a hole and the second opening in the printed circuit board is a notch.

21. The connector receptacle of claim 16 further comprising:
a top shield over the housing, the front portion of the printed circuit board, and the rear portion of the printed circuit board; and
a bottom shield under the housing and the front portion of the printed circuit board.

22. The connector receptacle of claim 10 further comprising:
a top shield over the housing, the front portion of the printed circuit board, and the rear portion of the printed circuit board; and
a bottom shield under the housing and the front portion of the printed circuit board.

* * * * *

UNITED STATES PATENT AND TRADEMARK OFFICE
CERTIFICATE OF CORRECTION

PATENT NO. : 9,972,943 B2
APPLICATION NO. : 15/274393
DATED : May 15, 2018
INVENTOR(S) : James M. Jeon and Mahmoud R. Amini It is certified that error appears in the above-identified patent and that said Letters Patent is hereby corrected as shown below:

In the Specification

In Column 7, Line 29, delete "tongue 210" and insert --tongue 212--; and

In Column 8, Line 31, delete "tongue 210" and insert --tongue 212--.

Signed and Sealed this
Tenth Day of July, 2018

Andrei Iancu
*Director of the United States Patent and Trademark Office*